US006566943B1

(12) United States Patent
Marble

(10) Patent No.: US 6,566,943 B1
(45) Date of Patent: May 20, 2003

(54) REFERENCE-FREE CHARGE TRANSFER AMPLIFIER

(75) Inventor: William J. Marble, Provo, UT (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/034,801

(22) Filed: Dec. 26, 2001

(51) Int. Cl.[7] .................................................. H03F 1/02
(52) U.S. Cl. .......................................... 330/9; 327/124
(58) Field of Search ....................... 330/9, 51; 327/124, 327/284, 554

(56) References Cited

U.S. PATENT DOCUMENTS

| | | | |
|---|---|---|---|
| 5,668,765 A | 9/1997 | Ang | 365/205 |
| 6,137,319 A | 10/2000 | Krishnamurthy et al. | 327/51 |
| 6,150,851 A | 11/2000 | Ohmi et al. | 327/91 |
| 6,249,181 B1 | 6/2001 | Marble | 330/9 |
| 6,356,148 B1 * | 3/2002 | Marble | 330/9 |

OTHER PUBLICATIONS

CMOS Charge–Transfer Preamplifier for Offset–Fluctuation Cancellation in Low–Power A/D Converters Koji Kotani, IEEE, Tadashi Shibata, Member, IEEE, and Tadahiro Ohmi, Member,IEEE IEEE Journal of Solid State circuits, vol. 33, No. 5, May 1998 pp. 762–769.
Feedback Charge–Transfer Comparator With Zero Static Power Koji Kotani, Tadahiro Ohmi ISSCC99/ Session 18/ Paper WA 18.7, 1999 IEEE International Solid–State Circuits Conference pp. 328–329.

Analysis of Dynamic Behavior of a Charge Transfer Amplifier William J. Marble, Member, IEEE and Donald T. Comer, Member, IEEE IEEE Transactions on Circuits and Systems: Fundamental Theory and Applications, Jul. 2001 Number of pages–9.
Ultra Low Power A/D Converters Using an Enhanced Differential Charge–Transfer Amplifier William J. Marble and Donald T. Comer Presented at 2000 Solid State Circuits Conference, Sep. 2000 Number of pages–4.
Analysis of the Behavior of a Dynamic Latch Comparator P. Cusinato, M. Bruccoleri, D. D. Caviglia, and M. Valle IEEE Transactions on Circuits and Systems—1: Fundamental Theory and Application, vol. 45, No. 3, Mar. 1998 pp. 294–298.

* cited by examiner

Primary Examiner—Steven J. Mottola
(74) Attorney, Agent, or Firm—Workman Nydegger & Seeley

(57) ABSTRACT

A charge transfer amplifier that performs amplification without a selective coupling to a precharge reference voltage. In lieu of the selective precharge coupling, the drain of the PMOS transistor is selectively coupled to Vss during the reset and precharge phases. In addition, the drain of the NMOS transistor is selectively coupled to Vss during the reset phase, and is selectively coupled to Vdd during the precharge phase. The drain of the PMOS transistor is capacitively coupled through a first intermediate capacitor to the output terminal of the charge transfer amplifier. The drain of the NMOS transistor is capacitively coupled through a second intermediate capacitor to the output terminal. During the amplify phase, the drains of the NMOS and PMOS transistor are permitted to float except for any charge flow through the respective transistor.

47 Claims, 7 Drawing Sheets

REFERENCE-FREE CHARGE TRANSFER AMPLIFIER

BACKGROUND OF THE INVENTION

1. The Field of the Invention

The present invention relates to circuits and methods for amplifying electrical signals. More specifically, the present invention relates to circuits and methods for performing amplification by charge transfer without using a reference voltage.

2. The Prior State of the Art

There are many circuits and methods conventionally available for amplifying an electrical signal. One type of amplifier is called a charge transfer amplifier. Charge transfer amplifiers operate on the principle of capacitive charge sharing. Voltage amplification is achieved by transferring a specific amount of charge between appropriately sized capacitors through an active device.

FIG. 1 illustrates a charge transfer amplifier 100 that utilizes an NMOS transistor MN1 to transfer charge between capacitors CT and CO. The operation of the NMOS charge transfer amplifier 100 will now be described in order to illustrate the basic principle of charge transfer amplification.

The NMOS charge transfer amplifier 100 operates on an amplifier cycle involving three phases including a reset phase, a precharge phase, and an amplify phase. FIG. 2 is a signal timing diagram for two input signals $S_1$ and $S_2$ with respect to the phase that the NMOS charge transfer amplifier 100 is operating in whether that phase be (a) the reset phase, (b) the precharge phase or (c) the amplify phase. The two input signals $S_1$ and $S_2$ control corresponding switches /S1 and /S2 of FIG. 1. FIG. 2 also shows a clock signal CLK. It is apparent that each amplifier cycle takes two complete clock cycles. The reset and precharge phases each take a half clock cycle, and the amplify phase takes a full clock cycle.

Throughout this application, signal $S_1$ controls switch S1 (not yet described) and switch /S1, and signal $S_2$ controls switch S2 (not yet described) and switch /S2. Although signal $S_3$ is not yet described and is not used in conventional charge transfer amplifiers, signal $S_3$ controls switch S3 (not yet described). The slash symbol "/" in the value of a switch indicates that the switch is closed when the corresponding control signal is low, and open when the corresponding control signal is high. Conversely, the absence of a slash symbol "/" in the value of a switch indicates that the switch is open when the corresponding control signal is low, and closed when the corresponding control signal is high. Similar nomenclature is used throughout this application for all the switches illustrated and/or described herein.

The cycle begins with the (a) reset phase in which the signal $S_1$ is low indicating that the switch /S1 is closed, and in which the signal $S_2$ is low indicating that the switch /S2 is closed. Since the switch /S1 is closed, the upper terminal of capacitor CT (i.e., node 101) is discharged through the switch /S1 to voltage Vss. Switch /S2 is closed indicating that the upper terminal of capacitor CO (i.e., node 102) is forced to a precharge reference voltage $V_{PR}$.

After the reset phase is the (b) precharge phase in which the signal $S_1$ is high indicating that switch /S1 is open, and in which the signal $S_2$ is low indicating that the switch /S2 remains closed. Thus, the upper terminal of the capacitor CO (i.e., node 102) remains charged to the precharge reference voltage $V_{PR}$. This precharge reference voltage $V_{PR}$ is high enough that current flows from node 102 to the capacitor CT (and node 101) through the NMOS transistor MN1. For example, if the precharge reference voltage $V_{PR}$ is at least equal to the input voltage $V_{IN}$ at the gate of the NMOS transistor MN1, then the discharge continues until the voltage at the capacitor CT increases to be equal to the input voltage $V_{IN}$ minus the threshold voltage (hereinafter "$V_{TN}$") of the NMOS transistor MN1. At that point, the NMOS transistor MN1 enters the cutoff region and current flow to the capacitor CT substantially ceases. Thus, at the end of the precharge phase, the capacitor CO ideally has a voltage of $V_{PR}$ while the capacitor CT has a voltage of $V_{IN}-V_{TN}$.

After the precharge phase is the (c) amplify phase in which both signals $S_1$ and $S_2$ are high indicating that both switches /S1 and /S2 are open. During the amplify phase, an incrementally positive input voltage change $\Delta V_{IN}$ applied at the gate of the NMOS transistor MN1 will cause the NMOS transistor MN1 to turn on thereby allowing current to flow through the NMOS transistor MN1 until the NMOS transistor MN1 is again cutoff. For small incrementally positive voltage changes $\Delta V_{IN}$, the NMOS transistor MN1 will cutoff when the voltage on the upper terminal of the capacitor CT (i.e., node 101) increases by the incrementally positive voltage change $\Delta V_{IN}$. The amount of charge transferred to the capacitor CT in order to produce this effect is equal to the incrementally positive voltage change $\Delta V_{IN}$ times the capacitance $C_T$ of the capacitor CT.

Since the charge $\Delta V_{IN} \times C_T$ transferred to the capacitor CT came from node 102 through transistor MN1, the charge $\Delta V_{IN} \times C_T$ was drawn from the capacitor CO. Thus, the voltage at the capacitor CO and the output voltage $V_{OUT}$ will change by $\Delta V_{IN} \times (C_T/C_O)$. If the capacitance $C_T$ is greater than the capacitance $C_O$, amplification occurs.

One advantage of the NMOS charge transfer amplifier 100 is that the voltage gain and power consumption may be controlled by setting the capacitance of the capacitors CO and CT as well as by setting the capacitance ratio $C_T/C_O$.

Another advantage of charge transfer amplifiers in general is that the circuit performance is generally unaffected by the absolute values of the supply voltage Vss and Vdd as long as these voltages permit proper biasing during the reset and precharge phases. In other words, charge transfer amplifiers have high supply voltage scalability in that no changes are needed for a charge transfer amplifier to operate using a wide range of supply voltages Vss and Vdd. Although the NMOS charge transfer amplifier 100 has these advantages, there are at least two disadvantages to amplifying using the NMOS charge transfer amplifier 100.

First, amplification only occurs if the input gate voltage change $\Delta V_{IN}$ is positive. A negative gate voltage change $\Delta V_{IN}$ would only cause the NMOS transistor MN1 to enter deeper into the cutoff region. Thus, charge transfer between node A and node B would be stifled thereby preventing amplification.

Second, leakage currents inherent in transistor MN1 will alter the expected zero-bias (i.e., no input signal) conditions on capacitors CT and CO during the amplify phase. This leakage current may be caused by current undesirably leaking from the source/drain diffusion regions of the NMOS transistor MN1 into the substrate in which they are formed. Leakage current may also be caused by current flowing between the source and drain terminals of the NMOS transistor MN1 even though the NMOS transistor MN1 is substantially cutoff. Either way, this leakage current effectively produces a voltage error at the output terminal that introduces amplification error.

FIG. 3 shows a conventional CMOS charge transfer amplifier 300 that substantially overcomes the above-described limitations of the NMOS charge transfer amplifier 100. The CMOS charge transfer amplifier 300 includes an NMOS charge transfer amplifier 301 that is similar to the NMOS charge transfer amplifier 100 described above, except that a switch S1 is provided between the source of the NMOS transistor MN1 and the charge transfer capacitor $CT_L$. This inhibits leakage current in the NMOS transistor MN1 during the reset phase.

For clarity, the NMOS charge transfer amplifier 301 is shown in FIG. 3 as being enclosed by a dotted box. The CMOS charge transfer amplifier 300 also includes a partially overlapping PMOS charge transfer amplifier 302 which is shown in FIG. 3 enclosed by a dashed box for clarity. The PMOS charge transfer amplifier 302 shares the voltage input line 303, the voltage output line 304 and the precharge line 305 with the NMOS charge transfer amplifier 301.

The PMOS charge transfer amplifier 302 is structured similar to the NMOS charge transfer amplifier 301 except that the PMOS charge transfer amplifier 302 uses a PMOS transistor MP1 instead of an NMOS transistor MN1 for transferring charge between capacitors. Also, node 201 of the PMOS charge transfer amplifier 302 is reset to a high voltage Vdd instead of the low voltage Vss and is capacitively coupled to the high voltage Vdd instead of the low voltage Vss.

The general operation of the PMOS charge transfer amplifier 302 for negative input voltage changes $\Delta V_{IN}$ is similar to the operation of the NMOS charge transfer amplifier 301 for positive voltage changes $\Delta V_{IN}$. Thus, the input signals $S_1$ and $S_2$ of FIG. 2 are used in the operation of the CMOS charge transfer amplifier 300. Due to the complementary nature of the NMOS charge transfer amplifier 301 and the PMOS charge transfer amplifier 302, the CMOS charge transfer amplifier 300 amplifies for both positive and negative input voltage changes $\Delta V_{IN}$ thereby overcoming one of the two described limitations of the NMOS charge transfer amplifier 100. Furthermore, the effect of the leakage current may be minimized by sizing the NMOS transistor MN1 and the PMOS transistor MP1 so that the leakage currents match closely. While the match is never perfect or even predictable, the overall voltage error is usually lowered relative to the voltage error of the NMOS charge transfer amplifier 100 alone.

As apparent from FIG. 3, there are five different voltages involved with the CMOS charge transfer amplifier 300. The input voltage $V_{IN}$ and the output voltage $V_{OUT}$ are, of course, inherent to the operation of an amplifier. The supply voltages Vdd and Vss are readily available to the circuit as a whole. Thus, there is very little cost in making these supply voltages available to the CMOS charge transfer amplifier 300. The precharge reference voltage $V_{PR}$ is also conventionally part of the charge transfer amplifier and is conventionally provided at a mid-supply level approximately midway between the supply voltages Vdd and Vss.

Conventional charge transfer amplifiers use the precharge reference voltage $V_{PR}$ for at least two good reasons. First, by supplying the precharge reference voltage $V_{PR}$ at mid-supply between Vdd and Vss, the output voltage $V_{OUT}$ is also precharged to mid-supply during the precharge phase. During the amplify phase, $\Delta V_{IN}$ causes the output voltage $V_{OUT}$ to change slightly. However, the output voltage $V_{OUT}$ is still generally centered at mid-supply. This is important for circuitry subsequent to the CMOS charge transfer amplifier 300. Such subsequent circuitry may include, for example, a dynamic latch comparator or another amplifier, and will typically have a limited range of allowable input voltage levels. An input voltage centered at mid-supply is typically within that limited range of allowable input voltage levels for subsequent circuitry.

The second good reason for using a mid-supply precharge reference voltage $V_{PR}$ is that this ensures proper self-biasing of the transistors MN1 and MP1 of the CMOS charge transfer amplifier 300 during the precharge and amplify phases. For these two reasons, the use of a precharge reference voltage $V_{PR}$ is standard in conventional charge transfer amplifiers.

Generating a voltage such as $V_{PR}$ that differs from the supply voltages Vdd and Vss poses logistical problems for many types of circuits. Generating the precharge reference voltage $V_{PR}$ off-chip may increase the overall size of the amplifier package. Generating the precharge reference voltage on-chip consumes valuable die real estate. Whether implemented on-chip or off-chip, the generation of the precharge reference voltage $V_{PR}$, results in Direct Current (or "DC") power dissipation and some degree of design complexity.

Accordingly, what is desired are circuits and methods for performing charge transfer amplification without using a precharge reference voltage $V_{PR}$.

SUMMARY OF THE INVENTION

The foregoing problems in the prior state of the art have been successfully overcome by the present invention, which is directed to circuits and methods performing charge transfer amplification without using a precharge reference voltage.

The charge transfer amplifier has a first supply voltage source (e.g., Vdd) and a second supply voltage source (e.g., Vss) that has a lower voltage than the first supply voltage source. The charge transfer amplifier also includes a PMOS transistor and an NMOS transistor that share a common gate terminal that is coupled to the input terminal. The charge transfer amplifier further includes a first input capacitor $CT_U$ capacitively coupling a first node (e.g., node A of FIG. 4) to a fixed voltage, a second input capacitor $CT_L$ capacitively coupling a second node (e.g., node B) to a fixed voltage, a first intermediate capacitor $CR_U$ capacitively coupling the output terminal to the drain of the PMOS transistor (e.g., node DP), and a second intermediate capacitor $CR_L$ capacitively coupling the output terminal to the drain of the NMOS transistor (e.g., node DN).

The charge transfer amplifier has an amplification cycle that includes a reset phase, a precharge phase, and an amplify phase. During the reset phase, a relatively fixed voltage ($V_{REF}$) is applied to the input terminal of the charge transfer amplifier. Node A is reset to Vdd, and node B, node DP, node DN, and the output terminal are reset to Vss. Optionally, node A is isolated from the source of the PMOS transistor, and node B is isolated from the source of the NMOS transistor during the reset phase to thereby reduce or prevent leakage current.

During the precharge phase, node A is disconnected from Vdd and connected to the source of the PMOS transistor. Node B is disconnected from Vss and connected to the source of the NMOS transistor. Node DN is coupled to Vdd. This result in charge from node A passing through the PMOS transistor and to the node DP until the voltage at node A equals the gate voltage minus the threshold voltage of the PMOS transistor, at which point the PMOS transistor becomes cutoff. Also, charge from node DN passes through the NMOS transistor and to the node B until the voltage at node B equals the gate voltage minus the threshold voltage of the NMOS transistor, at which point the NMOS transistor becomes cutoff.

During the amplify phase, an incremental voltage change is applied to the common gate terminal. Also the drain of the PMOS transistor is disconnected from Vss, and the drain of the NMOS transistor is disconnected from Vdd. For positive incremental voltage changes, the NMOS transistor temporarily exits the cutoff region and conducts charge from node DN to node B. This results in a voltage decrease at the output terminal that is proportional to the positive incremental voltage change. For negative incremental voltage changes, the PMOS transistor temporarily exits the cutoff region and conducts charge from node A to node DP. This result in a voltage increase at the output terminal that is proportional to the negative incremental voltage change.

The charge transfer amplification is performed without a precharge reference voltage. Accordingly, the increased package size due to on-chip implementation of the precharge reference voltage and/or the use of the die space occupied by the precharge reference voltage source may be avoided thus resulting in a more compact charge transfer amplifier.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The invention is described below by using diagrams to illustrate either the structure or processing of embodiments used to implement the circuits and methods of the present invention. Using the diagrams in this manner to present the invention should not be construed as limiting of the scope of the invention. Specific embodiments are described below in order to facilitate an understanding of the general principles of the present invention. Various modifications and variations will be apparent to one of ordinary skill in the art after having reviewed this disclosure.

Figure 1:
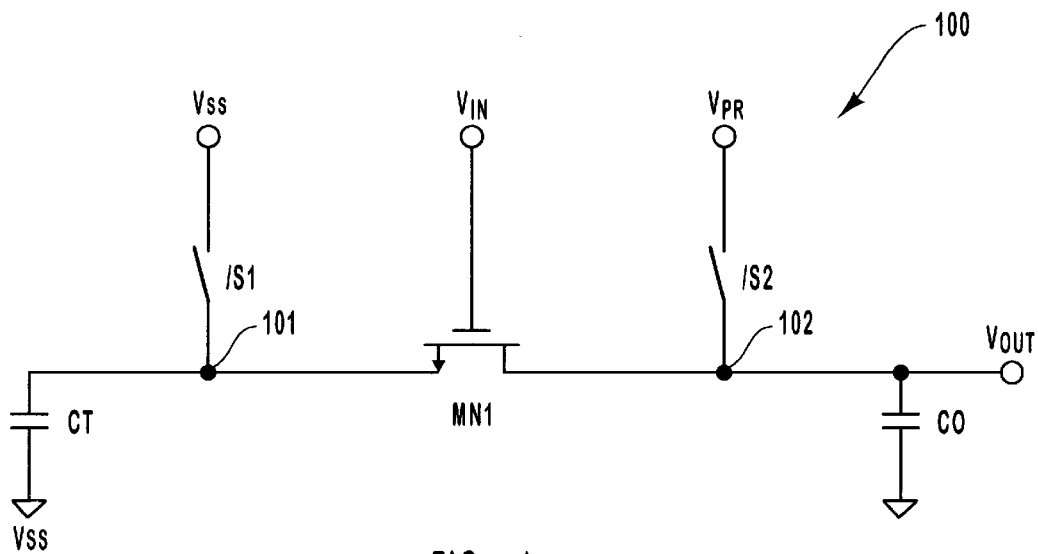
FIG. 1 is a circuit diagram of a conventional NMOS charge transfer amplifier.
Figure 2:
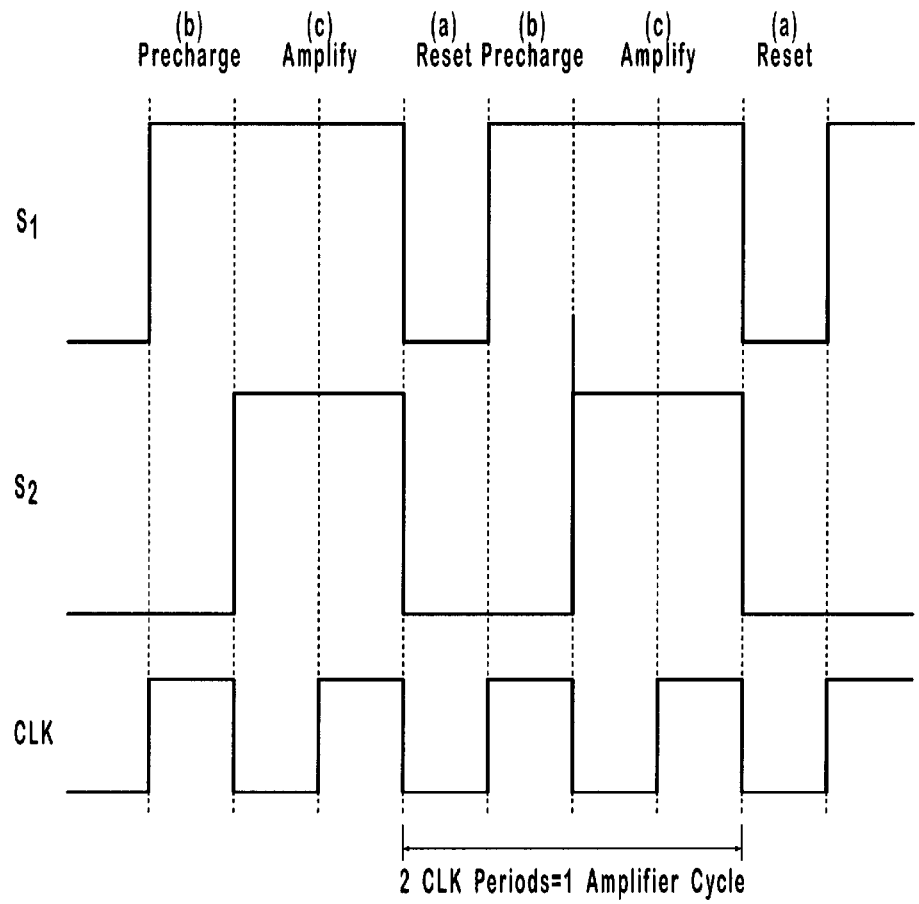
FIG. 2 is a timing diagram of several waveforms used to operate switches that control the NMOS charge transfer amplifier of FIG. 1, and to operate switches that control the CMOS charge transfer amplifier of FIG. 3.
Figure 3:
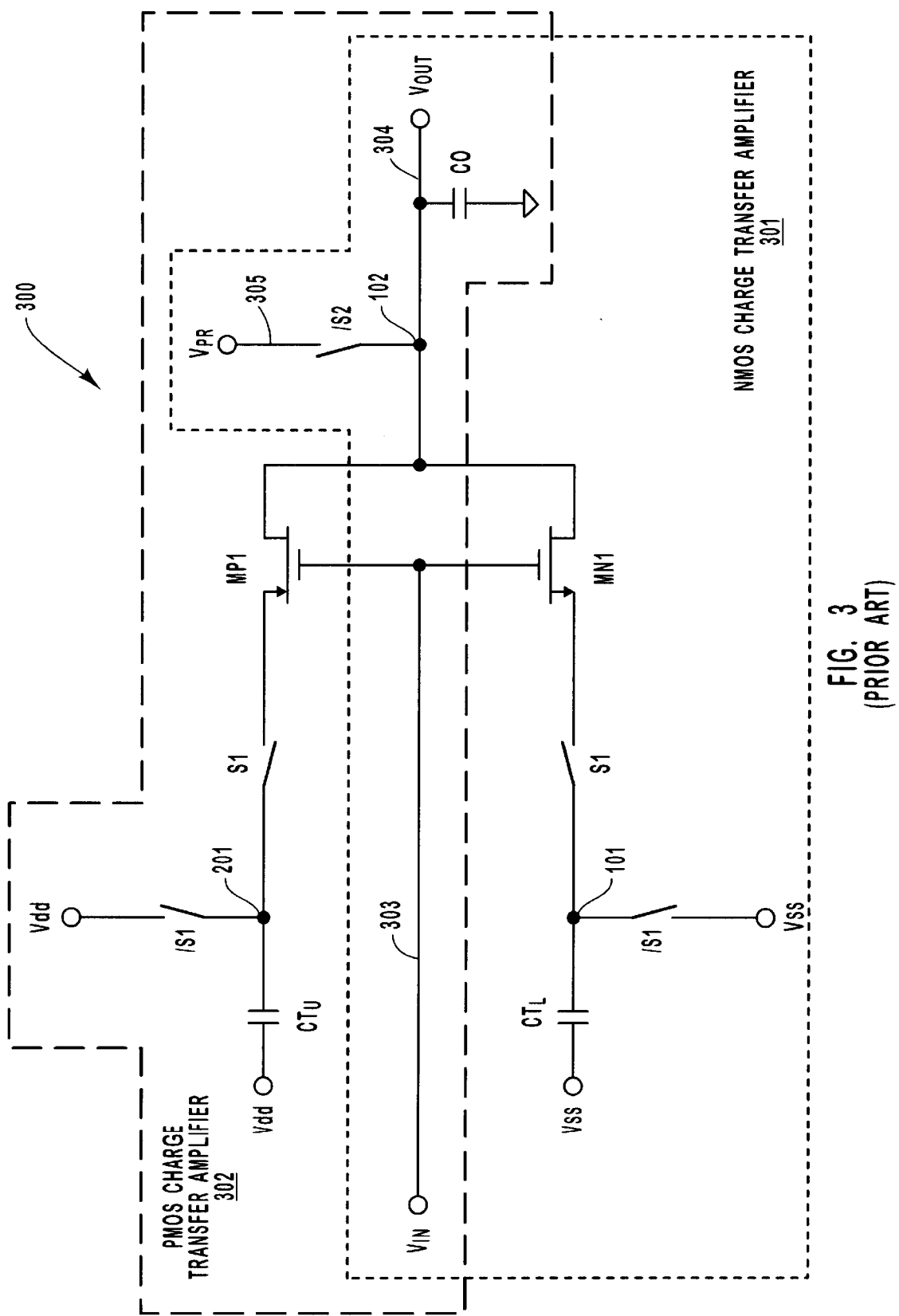
FIG. 3 is a circuit diagram of a conventional CMOS charge transfer amplifier.
Figure 4:
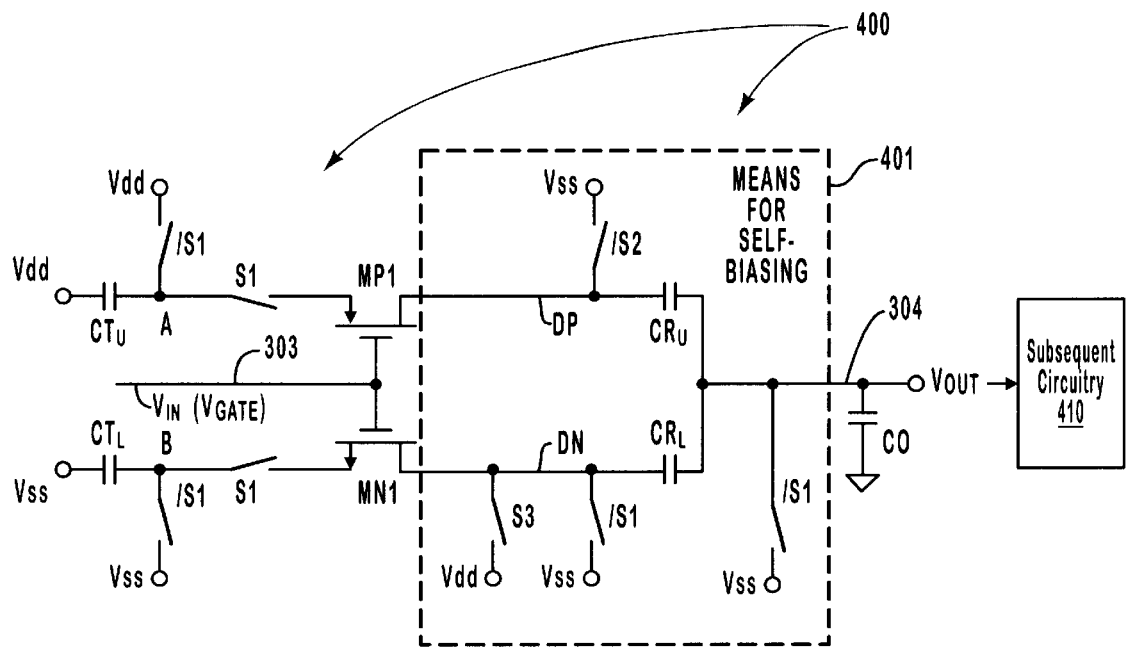
FIG. 4 is a circuit diagram of a reference-free charge transfer amplifier in accordance with the present invention.

FIG. 4 illustrates a reference-free charge transfer amplifier 400 in accordance with the present invention. The reference-free charge transfer amplifier 400 includes a few components that are similar to those described with respect to the CMOS charge transfer amplifier 300. In particular the components outside of the dashed box 401 are similar to corresponding components in the conventional CMOS charge transfer amplifier 300. However, as will be apparent from the following description, the similarities end there.

The circuit within the dashed box 401 represents a significant advancement in the art and represents an example of a means for self-biasing the charge transfer amplifier without using a precharge reference voltage source. The means for self-biasing accomplishes self biasing while still providing for a generally mid-supply centered voltage at the output terminal 304. In particular, the drain of the PMOS transistor MP1 (node DP) is selectively coupled to voltage source Vss through switch /S2. The drain of the PMOS transistor MP1 is capacitively coupled to the output terminal 304 through an upper reference capacitor $CR_U$. The drain of the NMOS transistor MN1 (node DN) is selectively coupled to voltage source Vss through switch /S1, and is selectively coupled to voltage source Vdd through switch S3. The drain of the NMOS transistor MN1 is also capacitive coupled to the output terminal 304, but through a lower reference capacitor $CR_L$.

Those skilled in the art will recognized that any switch illustrated and/or described herein may be replaced by more than one switch in order to obtain identical functionality. For example, in FIG. 4, switch /S2 selectively couples node DP to Vss. However, two switches (e.g., switch /S1 and switch S3) in parallel, selectively coupling node DP to Vss will provide an identical result. Wherever a single switch is illustrated in this description, those skilled in the art will recognize that that single switch may symbolically represent multiple switches and still be within the principles of the present invention.

Figure 5:
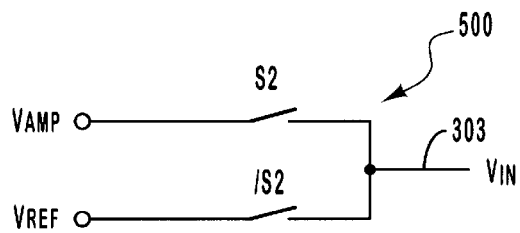
FIG. 5 illustrates an example input coupling circuit that may be used to impose preferred conditions to the input voltage of FIG. 4.

The reference-free charge transfer amplifier 400 operates in an amplification cycle that includes three phases: the reset phase, the precharge phase, and the amplify phase. During the reset phase and the precharge phase, the input voltage at the input terminal 303 (called herein both $V_{IN}$ and $V_{GATE}$) is preferably kept as fixed as possible until a voltage step $\Delta V_{IN}$ is applied at the input terminal 303 at the beginning of the amplify phase. FIG. 5 illustrates an input coupling circuit 500 that may accomplish these preferred input voltage conditions. The input coupling circuit 500 includes a reference voltage source $V_{REF}$ that represents the input voltage $V_{IN}$ during the reset and precharge phases. The reference voltage source $V_{REF}$ may be coupled to the input voltage line 303 of the reference-free charge transfer amplifier 400 through a switch /S2. An amplification voltage $V_{AMP}$ represents the input voltage $V_{IN}$ during the amplify phase. The amplification voltage $V_{AMP}$ is coupled to the input voltage line 303 through the switch S2. The incremental input voltage change $\Delta V_{IN}$ is equal to $V_{AMP}$ minus $V_{REF}$.

Figure 6:
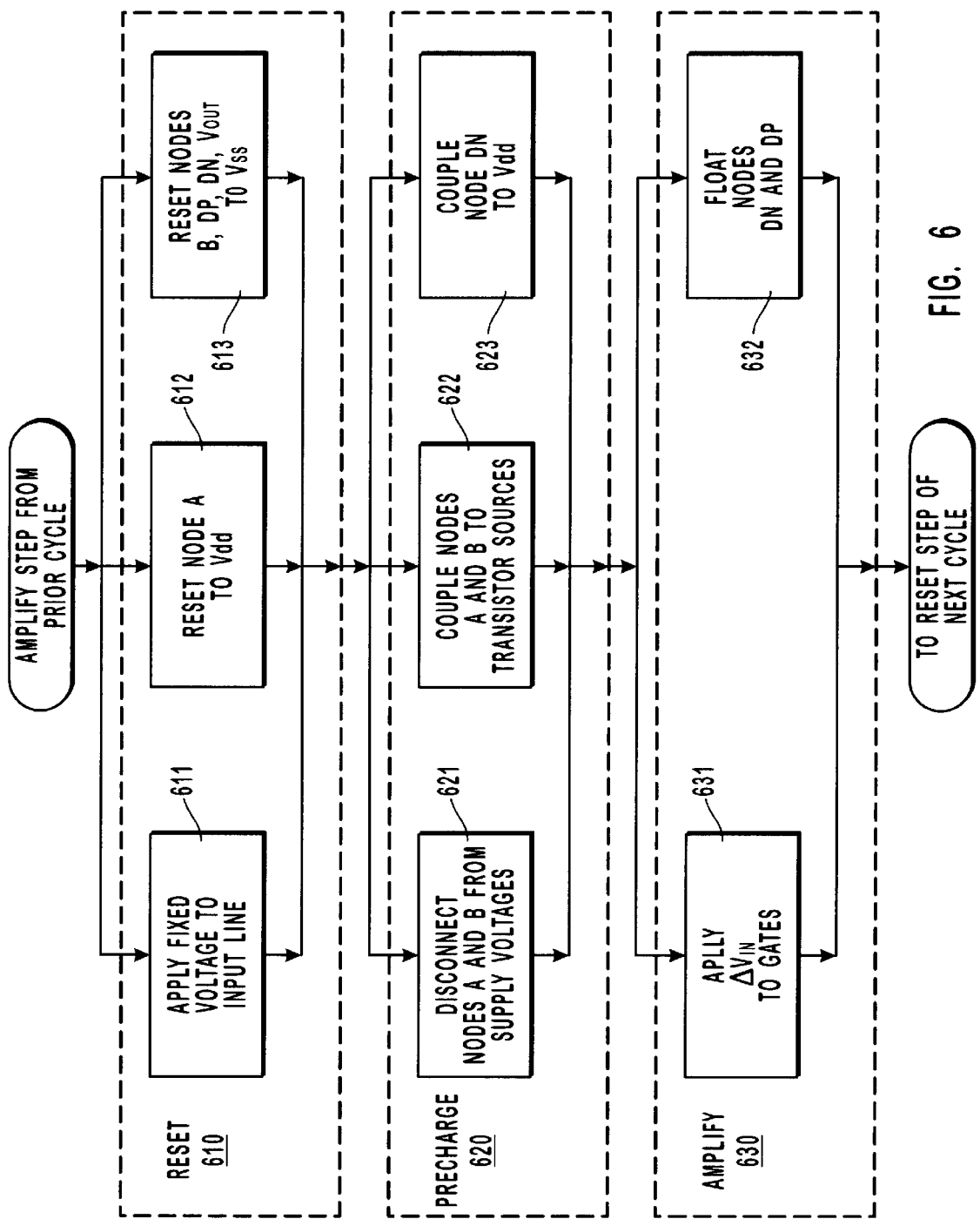
FIG. 6 is a flowchart showing the overall operation of the reference-free charge transfer amplifier.
Figure 7:
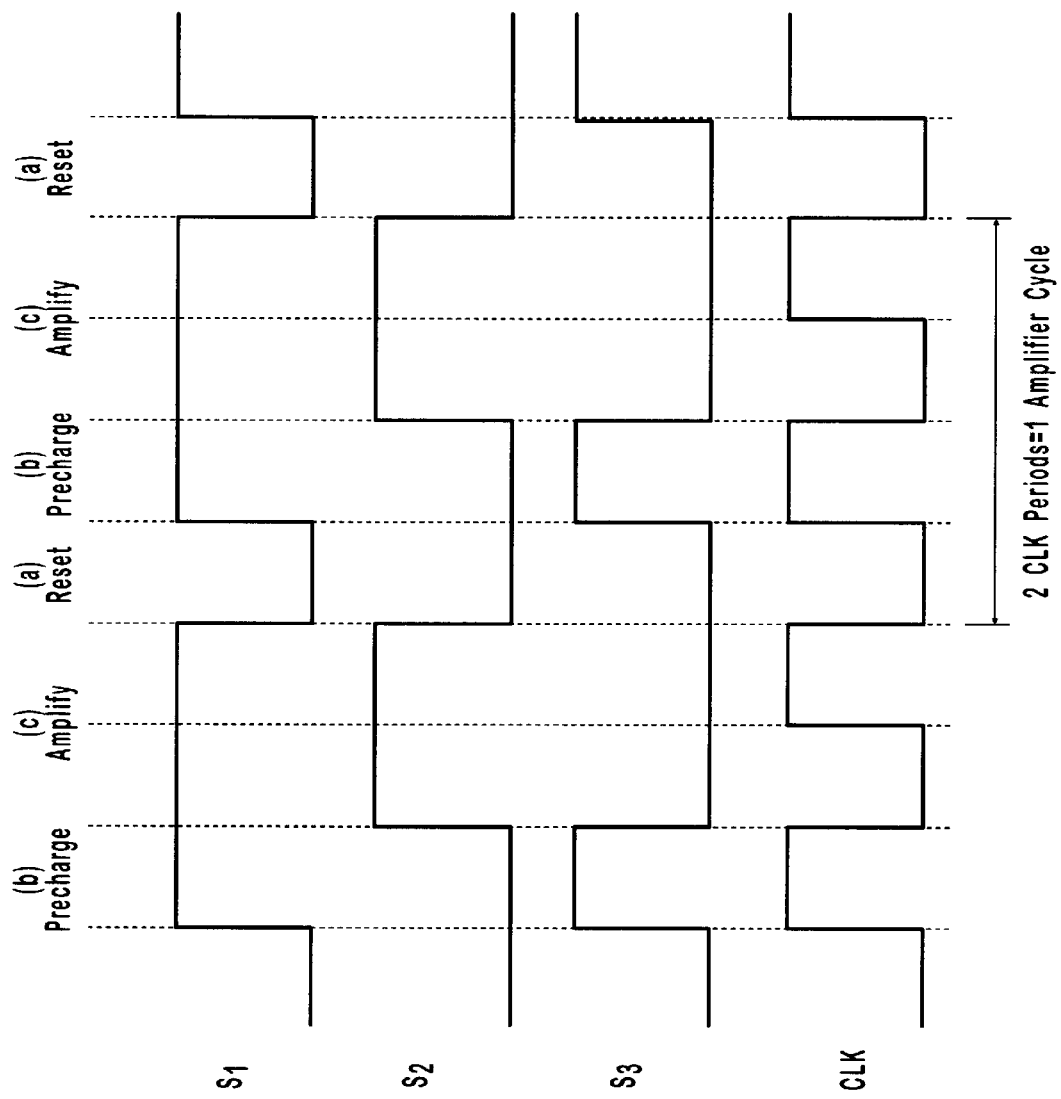
FIG. 7 is a timing diagram of several waveforms used to operate switches that control the reference-free charge transfer amplifier in accordance with the present invention.

FIG. 6 is a flowchart of the overall operation of the reference-free charge transfer amplifier 400. The amplifier 400 operates in an amplification cycle that includes a reset step 610, a precharge step 620, and an amplify step 630. Each step or phase is implemented by the manipulation of one or more of the switches S1, /S1, S2, /S2 and S3 illustrated in FIG. 4. FIG. 7 illustrates several timing signals $S_1$, $S_2$ and $S_3$ used to operate corresponding switches S1, /S1, S2, /S2 and S3 in order to implement (a) the reset step, (b) the precharge step, and (c) the amplify step of FIG. 6.

In the reset step 610, the reference-free charge transfer amplifier is reset. Specifically, the switches of FIG. 4 and FIG. 5 have the configuration defined in Table 1.

TABLE 1

| Switch | Status |
| --- | --- |
| S1 | Open |
| /S1 | Closed |
| S2 | Open |
| /S2 | Closed |
| S3 | Open |

Referring to FIG. 5, with these reset settings, a relatively fixed voltage $V_{REF}$ is applied to the input line 303 (act 611) via the switch /S2. Accordingly, $V_{GATE}$ is $V_{REF}$ during the reset phase.

Referring to FIG. 4, node A is reset to Vdd through switch /S1 (act 612). Nodes B, DP, DN, and the output terminal 304 are reset to Vss (act 613) through respectively switches /S1, /S2, /S1 and /S1. Current through the PMOS transistor MP1 and the NMOS transistor MN1 is blocked during the reset phase due to switch S1 being open. The isolation of node A but is not essential for the operation of the amplifier 400.

Figure 8:
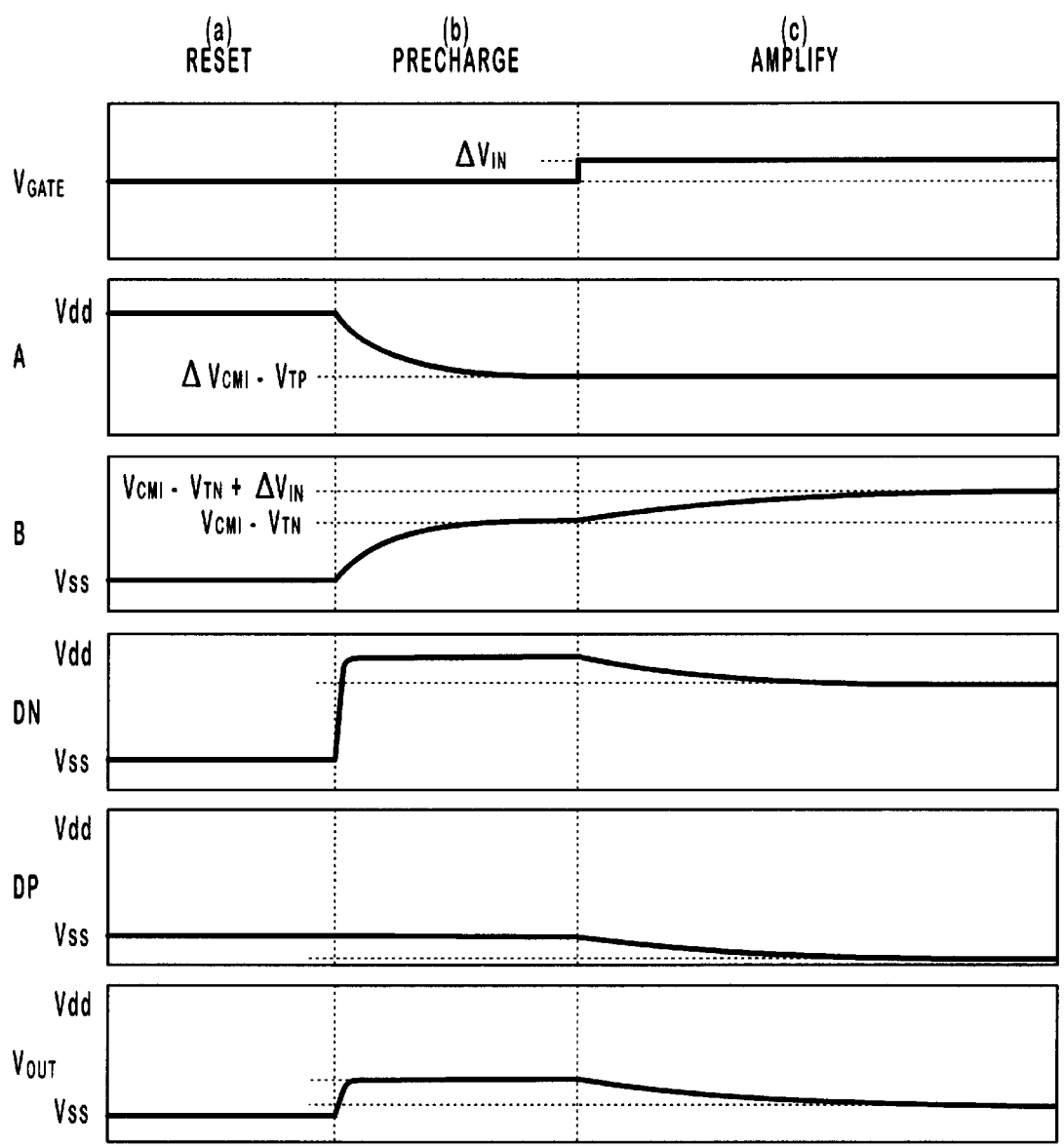
FIG. 8 is a timing diagram of several waveforms showing voltage states at various nodes of the differential-mode charge transfer amplifier during operation.

FIG. 8 illustrates waveforms showing the voltage states at the input terminal 303 (i.e., $V_{GATE}$), node A, node B, node DP, node D, and the output terminal (i.e., $V_{OUT}$). These waveforms are shown with respect to (a) the reset step 610, (b) the precharge step 620 and (c) the amplify step 630.

In the precharge step 620, the reference-free charge transfer amplifier is precharged. Specifically, the switches of FIG. 4 and FIG. 5 have the configuration defined in Table 2.

TABLE 2

| Switch | Status |
| --- | --- |
| S1 | Closed |
| /S1 | Open |
| S2 | Open |
| /S2 | Closed |
| S3 | Closed |

Referring to FIG. 5, with these precharge settings, there is no change in the settings for switch S2 and switch /S2. According, the relatively fixed voltage $V_{REF}$ remains applied to the input line 303. Accordingly, $V_{GATE}$ remains $V_{REF}$ during the precharge phase.

Referring to FIG. 4, nodes A and B are disconnected from their respective supply voltages Vdd and Vss (act 621) due to the opening of switch /S1. In addition, nodes A and B are coupled to the source terminals of the respective transistors MP1 and MN1 (act 622) due to the closing of switch S1. Node DP remains coupled to Vss through the switch /S2. However, node DN is decoupled from voltage Vss due to the opening of switch /S1, and is instead coupled to voltage Vdd (act 623) due to the closing of switch S3. Thus, the voltage at node DN increases sharply from Vss to Vdd at the beginning of the precharge phase as is illustrated in FIG. 8.

Note that in this state at the beginning of the precharge phase, the source of the PMOS transistor MP1 is initially at Vdd while the drain of the PMOS transistor is at Vss. Accordingly, if the gate voltage $V_{GATE}$ is equal to a common-mode voltage ($V_{CMI}$) approximately midway between the supply voltages Vss and Vdd, current will flow from node A, through the PMOS transistor MP1 and to the node DP until the voltage at node A is equal to the gate voltage (e.g., $V_{CMI}$) minus the threshold voltage of the PMOS transistor $V_{TP}$, at which point the PMOS transistor MP1 becomes substantially cutoff. Accordingly, FIG. 8 shows that the voltage at node A exponentially decays during the precharge phase to a value of $V_{CMI}$ minus the threshold voltage of the PMOS transistor $V_{TP}$. Note that the source to drain voltage for the PMOS transistor MP1 (Vdd–Vss) is greater that the source to drain voltage for the PMOS transistor in the convention amplifier 300 (Vdd–$V_{PR}$) Accordingly, precharge occurs faster using the a amplifier 400 than in the prior art amplifier 300. This makes faster operating frequencies possible.

With regards to the NMOS transistor MN1, the source of the NMOS transistor MN1 begins the precharge phase at Vss while the drain of the NMOS transistor MN1 is soon at Vdd. Accordingly, if the gate voltage $V_{GATE}$ is equal to a common-mode voltage ($V_{CMI}$) approximately midway between the supply voltages Vss and Vdd, current will flow from node DN, through the NMOS transistor MN1 and to the node B until the voltage at node B is equal to the gate voltage (e.g., $V_{CMI}$) minus the threshold voltage of the NMOS transistor $V_{TN}$, at which point the NMOS transistor MN1 becomes substantially cutoff. Accordingly, FIG. 8 shows that the voltage at node B has inverse exponentially decay during the precharge phase to a value of $V_{CMI}$ minus the threshold voltage of the NMOS transistor $V_{TN}$. The faster precharge times are also possible for the NMOS transistor MN1 due to the drain of the NMOS transistor MN1 being precharged to Vdd, while the source remains at Vss.

The sharp increase in the voltage at node DN causes the voltage $V_{OUT}$ at the output terminal to increase due to capacitive interpolation between Vss and Vdd, according to the following equation.

$$V_{OUT} = Vss + (Vdd - Vss)\frac{C_R}{2C_R + C_0}$$

where, $C_R$ is the capacitance of each of capacitors $CR_U$ and $CR_L$; and $C_O$ is the capacitance of the capacitor CO.

The final value of $V_{OUT}$ after the precharge phase becomes the common mode input voltage for subsequent circuitry. If $C_O$ were zero, the common mode output voltage would be exactly mid-supply assuming that the threshold voltage of PMOS transistor (i.e., $V_{TP}$) is the negative of the threshold voltage of the NMOS transistor (i.e., $V_{TN}$). If $C_O$ was zero, $V_{OUT}$ would be exactly mid-supply. However, assuming that there was some output capacitance $C_O$, the e $V_{OUT}$ would fall somewhere below mid-supply. CO is illustrated as a load capacitor for modeling purposes. However, CO often takes the form of parasitic input capacitance for subsequent circuitry 410. The subsequent circuitry 410 may be, for example, a dynamic latch comparator or another amplifier. When used with a subsequent dynamic latch comparator, the reference-free charge transfer amplifier facilitates an efficient voltage comparator.

Since the output capacitor CO often takes the form of parasitic capacitance, it may be difficult to control the value of $C_O$. Accordingly, in order to be as close to mid-supply as practicable, it would be best to make $C_R$ large enough that the attenuation due to $C_O$ is not too great. For example, if $C_O$ was 100 fF, $C_R$ was 200 fF, Vdd was 5.0 V and Vss was 0.0 V, then the above-equation would indicate that the output voltage would be 2.0 V. This is likely to accommodate the common-mode input requirements for many types of subsequent circuitry.

Note that the output voltage Vour during the precharge phase is tied directly to the fixed supply voltages Vss and Vdd. Accordingly, the output voltage $V_{OUT}$ remains fixed to the value calculated in the above-equation during the precharge phase.

In the amplify step 630, the reference-free amplifier 400 is used to perform amplification. Specifically, the switches of FIG. 4 and FIG. 5 have the configuration defined in Table 3.

TABLE 3

| Switch | Status |
|--------|--------|
| S1     | Closed |
| /S1    | Open   |
| S2     | Closed |
| /S2    | Open   |
| S3     | Open   |

Referring to FIG. 5, with these precharge settings, the amplification voltage $V_{AMP}$ is applied (act 631) to the input line 303 of the amplifier 400, resulting in a step voltage change of $\Delta V_{IN}$ where $\Delta V_{IN}$ equals $V_{AMP}$ minus $V_{REF}$. This step voltage change at the beginning of the amplify phase is illustrated in FIG. 8 for $V_{GATE}$.

Referring to FIG. 4, nodes DP and DN are both floating (act 632) except for potential charge paths through transistors MP1 and MN1 since switch /S1, /S2 and S3 are all open. For positive values of $\Delta V_{IN}$ as in the situation illustrated in FIG. 8, the NMOS transistor MN1 becomes incrementally biased thus temporarily exiting the cutoff region. This allows current to flow from node DN through NMOS transistor MN1 to node B until the voltage at node B rises by $\Delta V_{IN}$. Thus, as illustrated in FIG. 8 for the amplify phase, the voltage at node B increases from $V_{CMI}$ minus $V_{TN}$ to $V_{CMI}$ minus $V_{TN}$ plus $\Delta V_{IN}$.

Since node DN is floating, the voltage at node DN also decreases thereby pulling down the voltage $V_{OUT}$ at the output terminal 304, and the voltage at node DP through capacitive coupling. Also, since node DP is floating, the PMOS transistor MP1 becomes only more cutoff when $\Delta V_{IN}$ is positive.

For negative values of $\Delta V_{IN}$, the PMOS transistor MP1 becomes incrementally biased thus temporarily exiting the cutoff region. This allows current to flow from node A through PMOS transistor MP1 to node DP until the voltage at node A decreases by $\Delta V_{IN}$. Thus, the voltage at node A will decrease from $V_{CMI}$ minus $V_{TN}$ to $V_{CMI}$ minus $V_{TN}$ plus $\Delta V_{IN}$. Note that $\Delta V_{IN}$ is a negative number in this case. Accordingly, adding a negative number results in an overall voltage decrease. Since node DP is floating, the voltage at node DP increases thereby pulling up the voltage $V_{OUT}$ at the output terminal 304, and the voltage at node DN through capacitive coupling.

The two intermediary capacitors $CR_U$ and $CR_L$ introduce parasitic capacitance with respect to the output terminal 304. Accordingly, the reference-free amplifier 400 has a slightly decreased gain for a given $C_T$ and $C_O$ as compared to the conventional CMOS charge transfer amplifier 300. In addition, the reference-free amplifier 400 consumes slightly more dynamic power than the conventional CMOS charge transfer amplifier 300. However, in many applications, these drawbacks are more than compensated for by the benefits of not have to supply a precharge reference voltage.

Figure 9:
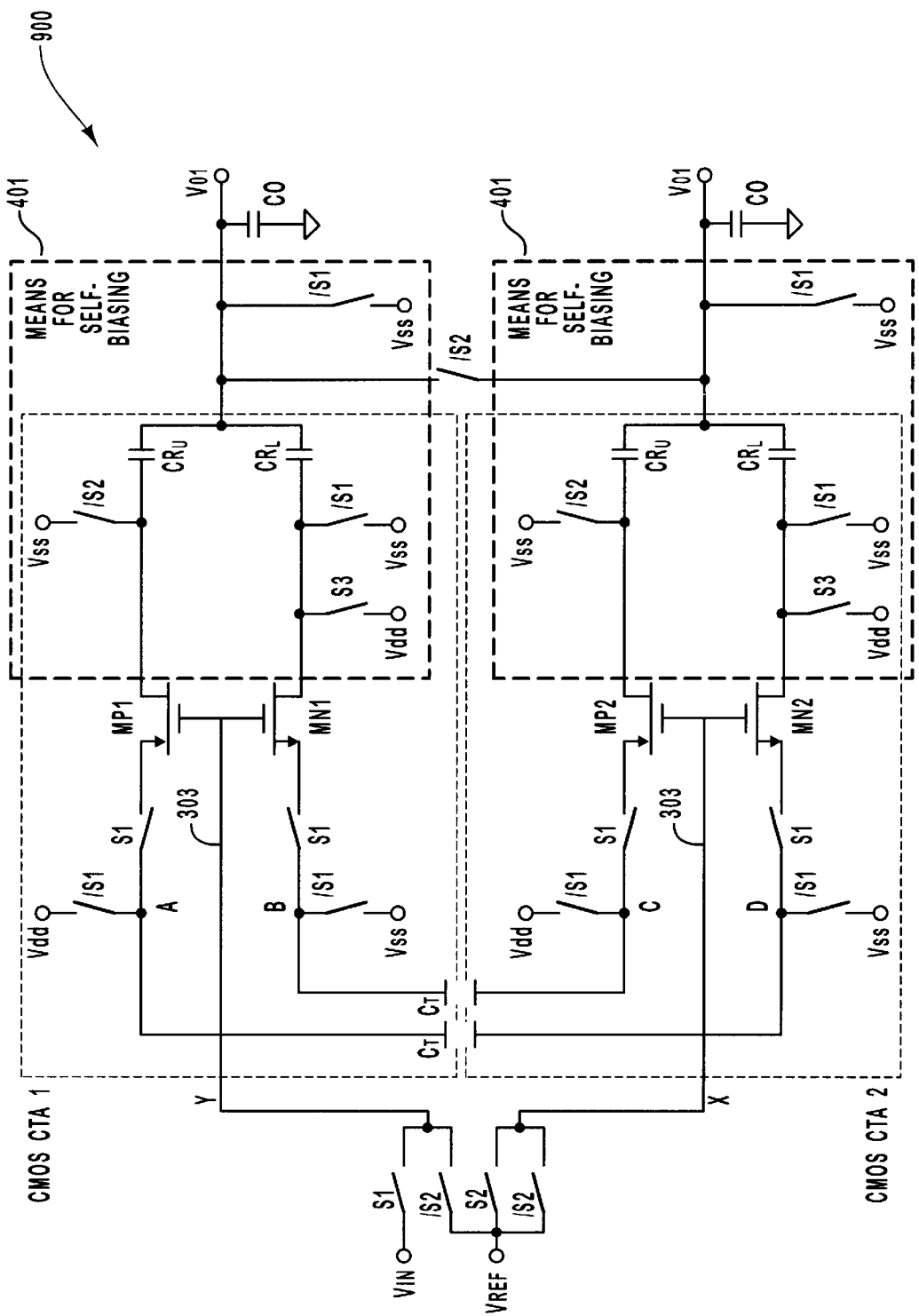
FIG. 9 illustrates the principles of the present invention incorporated into a differential-mode charge transfer amplifier.

The means for self-biasing 401 illustrated in FIG. 4 may be used to replace any selective coupling to a precharge voltage in any circuit. For example, a differential-mode charge transfer amplifier is described in commonly-owned U.S. Pat. No. 6,249,181 entitled "Differential-Mode Charge Transfer Amplifier" and issued to William J. Marble on Jun. 19, 2001 (hereinafter called "the issued patent"), and which is incorporated herein by reference in its entirety. FIG. 9 illustrates a differential-mode charge transfer amplifier in which the principles of the present invention may be employed. The differential mode charge transfer amplifier 900 is composed of two CMOS charge transfer amplifiers CMOS CTA1 and CMOS CTA2, each having the means for self-biasing 401 applied to the node where the conventional differential-mode charge transfer amplifier described in the issued patent was selectively coupled to the precharge reference voltage.

Accordingly, the principles of the present invention allow for circuits and methods for performing charge transfer amplification without requiring a precharge reference voltage. Having described the general principles of the present invention, a number of variations, modifications and deletions will be apparent to those of ordinary skill in the art. For example, although node A is described as being capacitively coupled to supply voltage Vdd, and node B is described as being capacitively coupled to supply voltage Vss, these nodes may be coupled to any voltage source. The more fixed that voltage source, the better the performance of the charge transfer amplifier. Those skilled in the art will recognize that it is impossible to obtain a fixed voltage to an infinite degree of precision. Any voltage source, even those considered fixed, will have some level of variation.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A charge transfer amplifier operating in an amplifier cycle having a reset phase, a precharge phase, and an amplify phase, the charge transfer amplifier having an input terminal, an output terminal, a first supply voltage source and a second supply voltage source that has a lower voltage than the first supply voltage source, the charge transfer amplifier configured to amplify the voltage at the input terminal onto the output terminal, the charge transfer amplifier comprising the following:

a PMOS transistor having a source terminal, a drain terminal, and a gate terminal;

an NMOS transistor having a source terminal, a drain terminal, and sharing a common gate terminal with the PMOS transistor, wherein the common gate terminal is coupled to the input terminal of the charge transfer amplifier;

a first input capacitor having a first terminal and a second terminal, the first terminal being coupled to a fixed voltage source;

a first node that is selectively coupled to the first supply voltage source and that is coupled to the second terminal of the first input capacitor;

a second input capacitor having a first terminal and a second terminal, the first terminal being coupled to a fixed voltage source;

a second node that is selectively coupled to the second supply voltage source and that is coupled to the second terminal of the second input capacitor;

a first intermediate capacitor having a first terminal and a second terminal, the second terminal of the first intermediate capacitor being coupled to the output terminal of the charge transfer amplifier;

a third node that is selectively coupled to the second supply voltage source that is coupled to the drain terminal of the PMOS transistor, and that is coupled to the first terminal of the first intermediate capacitor;

a second intermediate capacitor having a first terminal and a second terminal, the second terminal being coupled to the output terminal of the charge transfer amplifier; and a fourth node that is selectively coupled to the first supply voltage source, that is selectively coupled to the second supply voltage source, that is coupled to the drain terminal of the NMOS transistor, and that is coupled to the first terminal of the second intermediate capacitor.

2. A charge transfer amplifier in accordance with claim 1, wherein the first terminal of the first input capacitor is coupled to the first supply voltage source.

3. A charge transfer amplifier in accordance with claim 2, wherein the first terminal of the second input capacitor is coupled to the second supply voltage source.

4. A charge transfer amplifier in accordance with claim 1, wherein the first terminal of the first input capacitor is coupled to the second supply voltage source.

5. A charge transfer amplifier in accordance with claim 4, wherein the first terminal of the second input capacitor is coupled to the first supply voltage source.

6. A charge transfer amplifier in accordance with claim 1, wherein the first terminal of the second input capacitor is coupled to a fixed voltage other than the first or second supply voltage sources.

7. A charge transfer amplifier in accordance with claim 1, further comprising an output capacitor that has a first terminal and a second terminal, the first terminal being coupled to a voltage source, and the second terminal being coupled to the output terminal of the charge transfer amplifier.

8. A charge transfer amplifier in accordance with claim 7, wherein the output capacitor comprises a parasitic capacitance related to subsequent circuitry.

9. A charge transfer amplifier in accordance with claim 1, wherein the first node is selectively coupled to the source terminal of the PMOS transistor.

10. A charge transfer amplifier in accordance with claim 9, wherein second node is selectively coupled to the source terminal of the NMOS transistor.

11. A charge transfer amplifier in accordance with claim 1, wherein second node is selectively coupled to the source terminal of the NMOS transistor.

12. A charge transfer amplifier in accordance with claim 11, wherein the first node is selectively coupled to the source terminal of the PMOS transistor.

13. A charge transfer amplifier in accordance with claim 1, further comprising a first group of one or more switches that are configured to selectively couple the first node to the first supply voltage source during the reset phase, but not during the precharge phase or amplify phase.

14. A charge transfer amplifier in accordance with claim 13, further comprising a second group of one or more switches that are configured to selectively couple the second node to the second supply voltage during the reset phase, but not during the precharge phase or amplify phase.

15. A charge transfer amplifier in accordance with claim 14, further comprising a third group of one or more switches that are configured to selectively couple the third node to the second supply voltage during the reset phase and the precharge phase, but not during the amplify phase.

16. A charge transfer amplifier in accordance with claim 15, further comprising a fourth group of one or more switches that are configured to selectively couple the fourth node to the second voltage source during the reset phase, but not during the precharge phase or the amplify phase.

17. A charge transfer amplifier in accordance with claim 16, further comprising a fifth group of one or more switches that are configured to selectively coupled the fourth node to the first supply voltage during the precharge phase, but not during the reset phase or the amplify phase.

18. A charge transfer amplifier in accordance with claim 15, further comprising a fourth group of one or more switches that are configured to selectively coupled the fourth node to the first supply voltage during the precharge phase, but not during the reset phase or the amplify phase.

19. A charge transfer amplifier in accordance with claim 14, further comprising a third group of one or more switches that are configured to selectively couple the fourth node to the second voltage source during the reset phase, but not during the precharge phase or the amplify phase.

20. A charge transfer amplifier in accordance with claim 19, further comprising a fourth group of one or more switches that are configured to selectively coupled the fourth node to the first supply voltage during the precharge phase, but not during the reset phase or the amplify phase.

21. A charge transfer amplifier in accordance with claim 14, further comprising a third group of one or more switches that are configured to selectively coupled the fourth node to the first supply voltage during the precharge phase, but not during the reset phase or the amplify phase.

22. A charge transfer amplifier in accordance with claim 13, further comprising a second group of one or more switches that are configured to selectively couple the third node to the second supply voltage during the reset phase and the precharge phase, but not during the amplify phase.

23. A charge transfer amplifier in accordance with claim 22, further comprising a third group of one or more switches that are configured to selectively couple the fourth node to the second voltage source during the reset phase, but not during the precharge phase or the amplify phase.

24. A charge transfer amplifier in accordance with claim 23, further comprising a fourth group of one or more switches that are configured to selectively coupled the fourth node to the first supply voltage during the precharge phase, but not during the reset phase or the amplify phase.

25. A charge transfer amplifier in accordance with claim 22, further comprising a third group of one or more switches that are configured to selectively coupled the fourth node to the first supply voltage during the precharge phase, but not during the reset phase or the amplify phase.

26. A charge transfer amplifier in accordance with claim 13, further comprising a second group of one or more switches that are configured to selectively couple the fourth node to the second voltage source during the reset phase, but not during the precharge phase or the amplify phase.

27. A charge transfer amplifier in accordance with claim 26, further comprising a fifth group of one or more switches that are configured to selectively coupled the fourth node to the first supply voltage during the precharge phase, but not during the reset phase or the amplify phase.

28. A charge transfer amplifier in accordance with claim 13, further comprising a second group of one or more switches that are configured to selectively coupled the fourth node to the first supply voltage during the precharge phase, but not during the reset phase or the amplify phase.

29. A charge transfer amplifier in accordance with claim 1, further comprising a first group of one or more switches that are configured to selectively couple the second node to the second supply voltage during the reset phase, but not during the precharge phase or amplify phase.

30. A charge transfer amplifier in accordance with claim 29, further comprising a second group of one or more switches that are configured to selectively couple the third node to the second supply voltage during the reset phase and the precharge phase, but not during the amplify phase.

31. A charge transfer amplifier in accordance with claim 30, further comprising a third group of one or more switches that are configured to selectively couple the fourth node to the second voltage source during the reset phase, but not during the precharge phase or the amplify phase.

32. A charge transfer amplifier in accordance with claim 31, further comprising a fourth group of one or more switches that are configured to selectively coupled the fourth node to the first supply voltage during the precharge phase, but not during the reset phase or the amplify phase.

33. A charge transfer amplifier in accordance with claim 29, further comprising a second group of one or more switches that are configured to selectively couple the fourth node to the second voltage source during the reset phase, but not during the precharge phase or the amplify phase.

34. A charge transfer amplifier in accordance with claim 33, further comprising a third group of one or more switches that are configured to selectively coupled the fourth node to the first supply voltage during the precharge phase, but not during the reset phase or the amplify phase.

35. A charge transfer amplifier in accordance with claim 29, further comprising a second group of one or more switches that are configured to selectively coupled the fourth node to the first supply voltage during the precharge phase, but not during the reset phase or the amplify phase.

36. A charge transfer amplifier in accordance with claim 1, further comprising a first group of one or more switches that are configured to selectively couple the third node to the second supply voltage during the reset phase and the precharge phase, but not during the amplify phase.

37. A charge transfer amplifier in accordance with claim 36, further comprising a second group of one or more switches that are configured to selectively couple the fourth node to the second voltage source during the reset phase, but not during the precharge phase or the amplify phase.

38. A charge transfer amplifier in accordance with claim 37, further comprising a third group of one or more switches that are configured to selectively coupled the fourth node to the first supply voltage during the precharge phase, but not during the reset phase or the amplify phase.

39. A charge transfer amplifier in accordance with claim 36, further comprising a second group of one or more switches that are configured to selectively coupled the fourth node to the first supply voltage during the precharge phase, but not during the reset phase or the amplify phase.

40. A charge transfer amplifier in accordance with claim 1, further comprising a first group of one or more switches that are configured to selectively couple the fourth node to the second voltage source during the reset phase, but not during the precharge phase or the amplify phase.

41. A charge transfer amplifier in accordance with claim 40, further comprising a second group of one or more switches that are configured to selectively coupled the fourth node to the first supply voltage during the precharge phase, but not during the reset phase or the amplify phase.

42. A charge transfer amplifier in accordance with claim 1, further comprising a first group of one or more switches that are configured to selectively coupled the fourth node to the first supply voltage during the precharge phase, but not during the reset phase or the amplify phase.

43. A charge transfer amplifier in accordance with claim 1, further comprising an input coupling circuit comprising the following:
   a first group of one or more switches configured to couple the input terminal to a first voltage source during the reset phase and the precharge phase, but not during the amplify phase; and
   a second group of one or more switches configured to couple the input terminal to a second voltage source during the amplify phase, but not during the reset phase or the precharge phase.

44. A charge transfer amplifier operating in an amplifier cycle having a reset phase, a precharge phase, and an amplify phase, the charge transfer amplifier having an input terminal, an output terminal, a first supply voltage source and a second supply voltage source that has a lower voltage than the first supply voltage source, the charge transfer amplifier configured to amplify the voltage at the input terminal onto the output terminal, th&; charge transfer amplifier comprising the following:
   a PMOS transistor having a source terminal, a drain terminal, and a gate terminal;
   an NMOS transistor having a source terminal, a drain terminal, and sharing a common gate terminal with the PMOS transistor, wherein the common gate terminal is coupled to the input terminal of the charge transfer amplifier;
   a first input capacitor having a first terminal and a second terminal, the first terminal being coupled to a fixed voltage source;
   a first node that is selectively coupled to the first supply voltage source and that is coupled to the second terminal of the first input capacitor;
   a second input capacitor having a first terminal and a second terminal, the first terminal being coupled to a fixed voltage source;
   a second node that is selectively coupled to the second supply voltage source and that is coupled to the second terminal of the second input capacitor; and
   means for self-biasing the charge transfer amplifier without using a precharge voltage.

45. A method for amplifying an input signal that appears on the input terminal of a charge transfer amplifier onto an output terminal of the charge transfer amplifier without using a precharge reference voltage, the charge transfer amplifier having a first supply voltage source and a second supply voltage source that has a lower voltage than the first supply voltage source, the charge transfer amplifier also including a PMOS transistor, an NMOS transistor that shares a gate terminal with the PMOS transistor, the common gate terminal being coupled to the input terminal, the charge transfer amplifier further including a first input capacitor capacitively coupling a first node to a fixed voltage, a second input capacitor capacitively coupling a second node to a fixed voltage, a first intermediate capacitor capacitively coupling the output terminal to the drain of the PMOS transistor, and a second intermediate capacitor capacitively coupling the output terminal to the drain of the NMOS transistor, the method comprising the following:

resetting the charge transfer amplifier by applying a relatively fixed voltage to the input terminal, resetting the first node to the first supply voltage, and resetting the second node, the drain of the PMOS transistor, the drain of the NMOS transistor, and the output terminal to the second supply voltage;

precharging the charge transfer amplifier by disconnecting the first node from the first supply voltage, disconnecting the second node from the second supply voltage, and coupling the drain of the NMOS transistor to the first supply voltage; and amplifying using the charge transfer amplifier by applying an incremental voltage change to the common gate terminal, disconnecting the drain of the PMOS transistor from the second voltage source, and disconnecting the drain of the NMOS transistor from the first voltage source.

46. A method in accordance with claim 45, wherein the act of resetting further comprises an act of coupling the first node to the source of the PMOS transistor, and coupling the second node to the source of the NMOS transistor.

47. A method in accordance with claim 45, further comprising propagating the output signal on the output terminal to a dynamic latch compactor to form a voltage comparator.

* * * * *

UNITED STATES PATENT AND TRADEMARK OFFICE
CERTIFICATE OF CORRECTION

PATENT NO.     : 6,566,943 B1
DATED          : May 20, 2003
INVENTOR(S)    : William J. Marble It is certified that error appears in the above-identified patent and that said Letters Patent is hereby corrected as shown below:

Column 6,
Line 44, after "will" change "recognized" to -- recognize --

Column 7,
Line 15, before "and S3" change "S2" to -- /S2 --

Column 8,
Line 25, after "(Vdd-$V_{PR}$)" insert a period
Line 26, before "amplifier" delete "a"
Line 67, after "the" change "e" to -- voltage --

Column 9,
Line 18, after "voltage" change "Vour" to -- Vout --

Column 10,
Line 14, after "not" change "have" to -- having --

Signed and Sealed this

Twenty-first Day of October, 2003

JAMES E. ROGAN
*Director of the United States Patent and Trademark Office*